United States Patent
Henrickson

(10) Patent No.: US 9,835,470 B2
(45) Date of Patent: Dec. 5, 2017

(54) MEMS SENSOR FILTERING WITH ERROR FEEDBACK

(71) Applicant: Honeywell International Inc., Morristown, NJ (US)

(72) Inventor: Jens M. Henrickson, St. Paul, MN (US)

(73) Assignee: Honeywell International Inc., Morris Plains, NJ (US)

( * ) Notice: Subject to any disclaimer, the term of this patent is extended or adjusted under 35 U.S.C. 154(b) by 279 days.

(21) Appl. No.: 14/227,170

(22) Filed: Mar. 27, 2014

(65) Prior Publication Data

US 2015/0276429 A1  Oct. 1, 2015

(51) Int. Cl.
| | | |
|---|---|---|
| *G01D 3/00* | (2006.01) | |
| *G01C 19/5776* | (2012.01) | |
| *G01R 33/00* | (2006.01) | |
| *G01R 33/028* | (2006.01) | |
| *G01C 19/00* | (2013.01) | |
| *G01P 15/00* | (2006.01) | |
| *G01P 15/08* | (2006.01) | |
| *G01R 33/02* | (2006.01) | |

(52) U.S. Cl.
CPC ............... *G01D 3/00* (2013.01); *G01C 19/00* (2013.01); *G01C 19/5776* (2013.01); *G01P 15/00* (2013.01); *G01P 15/0802* (2013.01); *G01R 33/0041* (2013.01); *G01R 33/02* (2013.01); *G01R 33/0286* (2013.01)

(58) Field of Classification Search
None
See application file for complete search history.

(56) References Cited

U.S. PATENT DOCUMENTS

| 5,170,969 A | * | 12/1992 | Lin | ...................... G05D 1/0808 |
| | | | | 244/175 |
| 5,444,788 A | * | 8/1995 | Orban | ................... H03G 7/002 |
| | | | | 333/14 |
| 5,940,519 A | * | 8/1999 | Kuo | .................... G10K 11/1784 |
| | | | | 381/71.1 |

(Continued)

FOREIGN PATENT DOCUMENTS

EP    2112472    10/2009

OTHER PUBLICATIONS

European Patent Office, "Extended European Search Report from EP Application No. 15158719.3 dated Aug. 20, 2015", "from Foreign Counterpart of U.S. Appl. No. 14/227,170", dated Aug. 20, 2015, pp. 1-5, Published in: EP.

*Primary Examiner* — Alexander Satanovsky
*Assistant Examiner* — Brent A Fairbanks
(74) *Attorney, Agent, or Firm* — Fogg & Powers LLC

(57) ABSTRACT

Systems and methods for filtering a micro-electromechanical system sensor rate signal with error feedback are provided. In one example, a micro-electromechanical system sensor rate signal is provided. Next, a feedback signal from a feedback loop is subtracted from the micro-electromechanical system sensor rate signal to produce a first combined signal. The first combined signal is then filtered to produce a filtered rate output. The micro-electromechanical system sensor rate signal is then subtracted from the filtered rate output to produce an error signal, wherein the error signal is used in the feedback loop to generate a feedback signal for a future time step.

17 Claims, 3 Drawing Sheets

(56) References Cited

U.S. PATENT DOCUMENTS

| | | | | |
|---|---|---|---|---|
| 5,974,156 | A * | 10/1999 | Sauvagerd | H03H 21/0012 333/28 T |
| 7,319,570 | B2 * | 1/2008 | Jia | G11B 5/59605 360/77.02 |
| 7,421,343 | B2 * | 9/2008 | Hawkinson | G01C 21/16 244/173.2 |
| 8,527,228 | B2 | 9/2013 | Panagas | |
| 8,583,392 | B2 | 11/2013 | Panagas | |
| 2005/0240347 | A1 | 10/2005 | Yang | |
| 2006/0082255 | A1 * | 4/2006 | Kato | G01C 19/56 310/319 |
| 2008/0223107 | A1 * | 9/2008 | Stewart | G01C 25/005 73/1.38 |
| 2010/0323641 | A1 * | 12/2010 | Aparin | H03F 1/34 455/114.3 |
| 2011/0066395 | A1 | 3/2011 | Judd | |
| 2013/0104656 | A1 * | 5/2013 | Smith | G01P 15/125 73/514.32 |
| 2013/0110441 | A1 * | 5/2013 | Buhmann | G01D 3/02 702/104 |

* cited by examiner

MEMS SENSOR FILTERING WITH ERROR FEEDBACK

BACKGROUND

Micro-electromechanical systems (MEMS) can include various sensors, such as gyroscopes, accelerometers and magnetometers. These sensors can be implemented in various control systems and inertial navigation applications, such as an Inertial Measurement Unit (IMU). The operation of a MEMS sensor can be disrupted or stopped when subjected to very high levels of shock or vibration. As a result, MEMS sensors often require filtering to improve performance during vibration and shock environments.

SUMMARY

Systems and methods for filtering a micro-electromechanical system sensor rate signal with error feedback are provided. In one example, a micro-electromechanical system sensor rate signal is provided. Next, a feedback signal from a feedback loop is subtracted from the micro-electromechanical system sensor rate signal to produce a first combined signal. The first combined signal is then filtered to produce a filtered rate output. The micro-electromechanical system sensor rate signal is then subtracted from the filtered rate output to produce an error signal, wherein the error signal is used in the feedback loop to generate a feedback signal for a future time step.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

While filtering of a MEMS sensor rate signal can provide many useful benefits, it can also be detrimental in some applications because errors can accumulate in the rate signal. For example, when filters are used in MEMS sensors for navigation purposes, large angles due to rate limiting and other types of filters can accumulate in the rate signal, which can cause heading or attitude problems. Embodiments described herein provide for systems and methods of feeding back the signal error due to filtering, to reduce accumulation of errors in the system. As a result, the proposed systems and methods allow arbitrary sensor rate signal filtering with reduced impact to navigation performance.

Figure 1A:
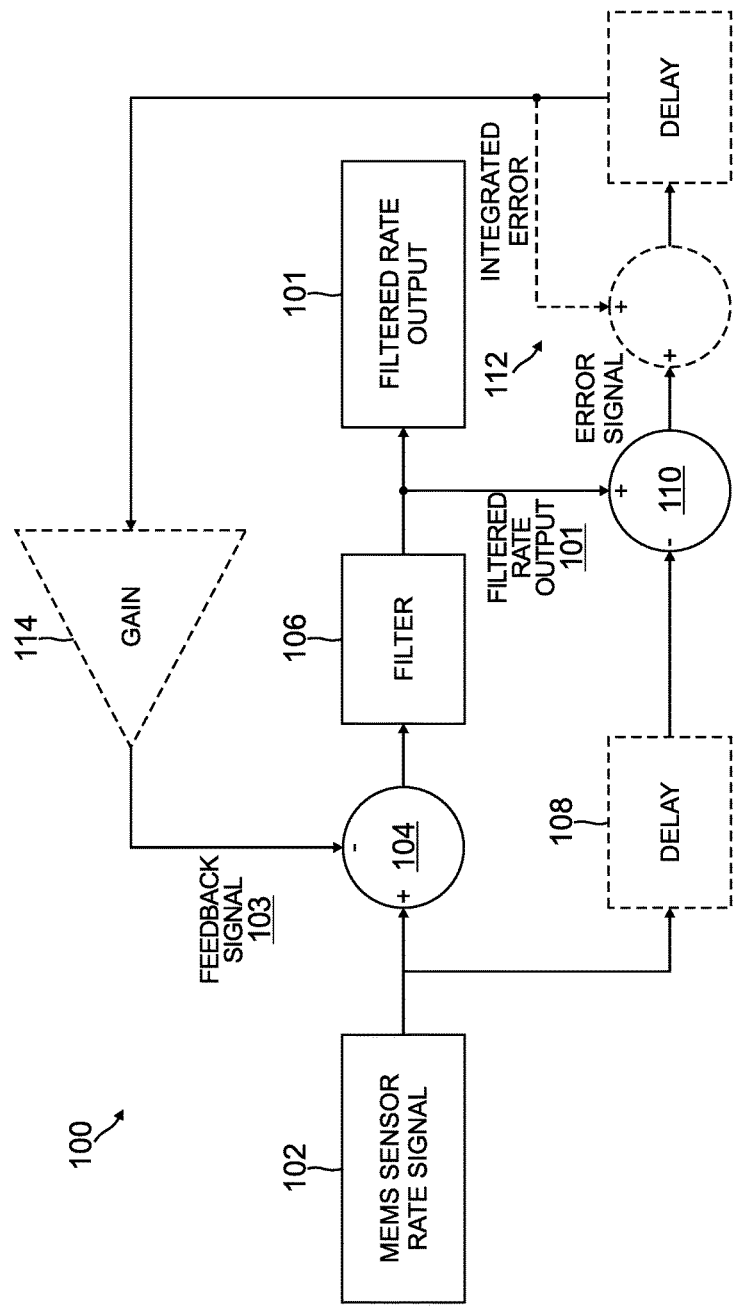
FIGS. 1A and 1B are flow diagrams of an example method of MEMS sensor filtering with error feedback.
Figure 1B:
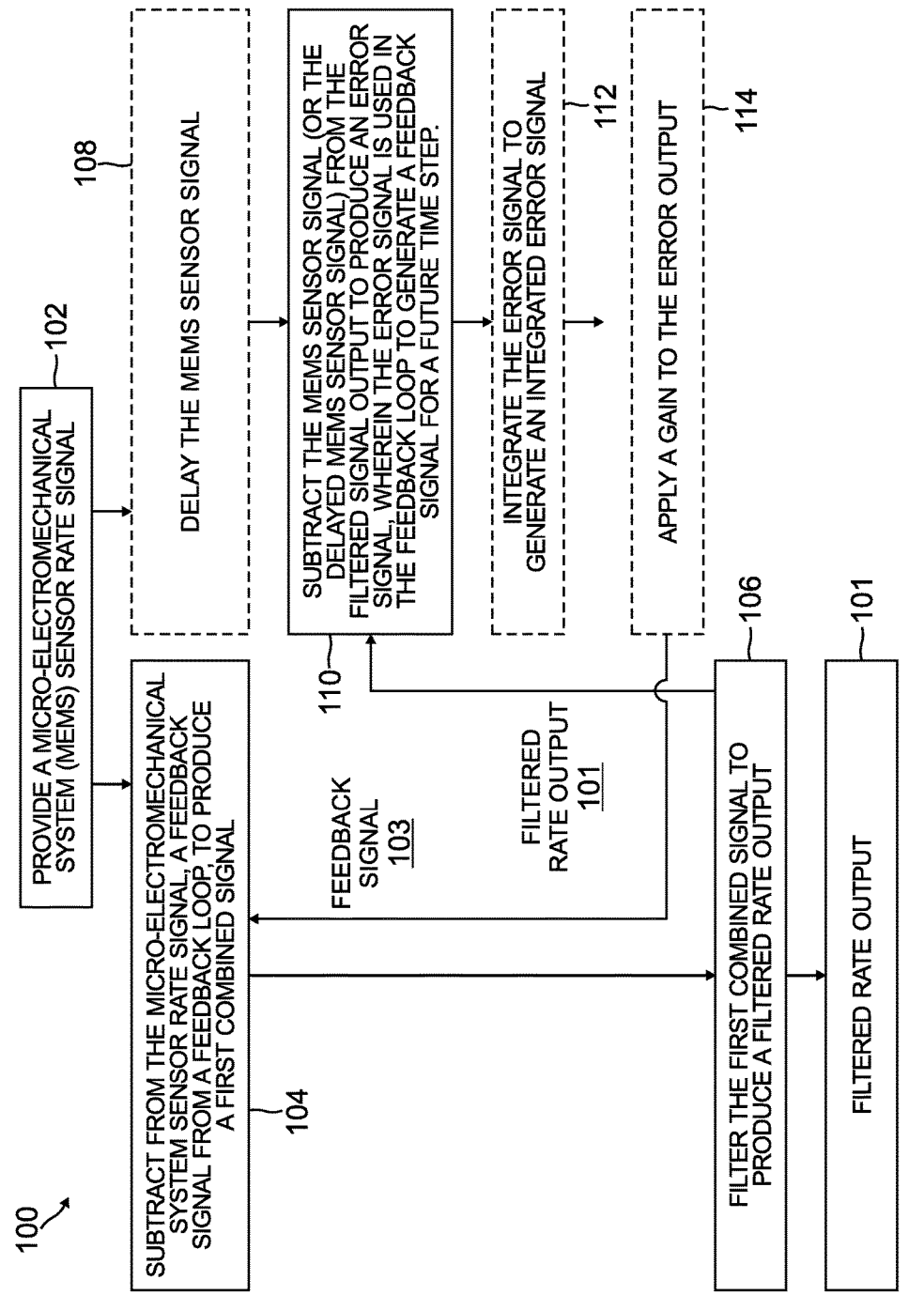

FIGS. 1A and 1B are flow diagrams of an example method 100 for filtering a MEMS sensor rate signal. In exemplary embodiments, method 100 receives a MEMS sensor rate signal and operates on the MEMS sensor rate signal to generate a filtered rate output 101 as well as a feedback signal 103 for a future iteration of method 100. A given iteration of method 100 is also referred to herein as a "time step" of method 100.

The filtered rate output 101 is generated by applying one or more filters to the MEMS sensor rate signal 102. The feedback signal is generated based on the difference between the filtered rate output 101 and the MEMS sensor rate signal 102 (that is, the difference between the input signal and the output signal of method 100). The difference between the MEMS sensor rate signal 102 and the filtered rate output 101 is the change in the MEMS sensor rate signal 102 caused by the filter in the current time step (iteration) of the method 100. This change, although purposely applied to the MEMS sensor rate signal 102 by the filter, causes the filtered rate output 101 to not include all of the actual measurement obtained by the MEMS sensor. Since the MEMS sensor rate signal 102 is an accumulated signal (i.e., the MEMS sensor rate signal 102 at the current time represents the change from the MEMS sensor rate measured in the previous time), the change in the MEMS sensor rate 102 signal caused by the filter will accumulate over time. If, as in a conventional MEMS sensor, the change caused by the filter is ignored, the change results in a measurement error in the filtered rate output 101. Accordingly, the change applied by the filter to the MEMS sensor rate signal 102 (that is, the difference between the MEMS sensor rate signal 102 and the filtered rate output 101) is an error signal. Based on this error signal, method 100 applies a feedback signal to the MEMS sensor rate signal 102 for a future time step(s) in order to reduce accumulation of this error in the filtered rate output 101. More detail regarding method 100 is provided below.

The input signal for method 100 is a MEMS sensor rate signal (block 102). As is known, MEMS sensors can be used in a variety of applications to measure information about a system to which the MEMS sensor is incorporated into. For example, MEMS sensors can be used in gyroscopes, accelerometers and magnetometers. In these applications, the MEMS sensor will measure the angular rotation, linear acceleration and orientation of the MEMS, respectively. This measurement from the MEMS sensor is the rate signal acted on in method 100 (block 102). Although method 100 relates to filtering of the rate signal, additional filtering of the rate signal may occur prior to being acted on in method 100. Such filtering, if present, would not be a part of method 100 discussed herein. Therefore, in some embodiments, the rate signal 102 input into method 100 is a raw unfiltered signal from the MEMS sensor. In other embodiments, the MEMS rate signal 102 is filtered prior to use in method 100, and method 100 applies additional filtering to generate a filtered rate output 101 and also generates a feedback signal based on the additional filtering.

As discussed above, one or more filters are applied to the MEMS sensor rate signal 102 (block 106) to, for example, smooth the response from the MEMS sensor. Filtering the MEMS sensor rate signal 102 (block 106) produces the filtered rate output 101. Filtering the MEMS sensor rate signal 102 can include applying any appropriate filter including but not limited to a finite impulse response filter, an infinite impulse response filter, a rate limiting filter, a clipping filter and a smoothing filter. In addition, in some embodiments, more than one filter can be applied to the first combined signal. The type of filters and the number of filters used can depend on the applications for which the MEMS sensor will be used. The filtered rate output 101 is the output of method 100 which can be used for further processing such as, to generate a navigation solution.

As also discussed above, method 100 includes generating a feedback signal 103 based on the error caused by filtering the MEMS signal (block 106). The feedback signal 103 is generated by a feedback loop which is described below with respect to blocks 108-114.

In order to generate the feedback signal 103, the error caused by filtering the MEMS signal (block 106) is determined (block 110). This error is determined by calculating the difference between the filtered rate output 101 and the MEMS sensor rate signal 102 to which that filtered rate output 101 corresponds. In an example, this difference is calculated by subtracting the MEMS sensor rate signal 102 from the filtered rate output 101 to produce an error signal. The difference between these two signals is the amount of signal that the filter had eliminated due to its filtering in block 106. That is, each time a rate measurement is made by the sensor, if there is a filter applied to it, there may be some information that is removed which if not accounted for could end up accumulating in the system. For example, if a filter is applied to an acceleration experienced by the MEMS sensor, the filtered output could be a fraction of the actual acceleration. The difference between the filtered output and the actual acceleration is the error signal.

The MEMS sensor rate signal 102 that corresponds to the filtered rate output 101 is the time step or one of the time steps of the MEMS sensor rate signal 102 that is filtered in block 106 to generate the filtered output signal 101. Some types of filters, such as a rate limiting filter or clipping filter, used in block 108 do not introduce any delay in the filtered rate output 101 relative to the MEMS sensor rate signal 102. For such filters that do not introduce delay, the MEMS sensor rate signal 102 that corresponds to the filtered rate output 101 for a given time step is the MEMS sensor rate signal 102 for that same time step. In a situation where none of the filters applied in block 106 introduce a delay, the MEMS sensor rate signal 102 input into method 100 for a given time step can be differenced with the filtered rate output 101 for that same time step.

Other types of filters used in block 106 (such as finite impulse response filter or an infinite impulse response filter) introduce a group delay into the filtered rate output. In such an example where one or more of the filters applied in block 106 introduces a delay, the MEMS sensor rate signal from block 102 is delayed (block 108) prior to being differenced with the filter rate output 101. The delay in block 108 is used to compensate for the group delay introduced by the filtering in block 106. Stated another way, the delay provided in block 108 is to synchronize the MEMS sensor rate signal from block 102 and the filtered rate output from block 106, so that the two signals correspond to an equivalent point in time. In any case, the result of differencing the filtered rate output 101 from the MEMS sensor rate signal 102 is an error signal that is used to generate the feedback signal 103.

In exemplary embodiments, the error signal is integrated to generate an integrated error signal (block 112). The advantage of incorporating block 112 into method 100 is that it allows the accumulated filtering error to be redistributed over a timeframe controlled by the feedback gain 114. For example, assume there was a large positive error output for a given sample (time step). The integrator 112 retains the large positive error incurred in that time step and allows it to be redistributed back into the filtered rate output 101 over multiple future time steps. Without integration, the filtering error for a given time step would be lost for future time steps, thereby removing the ability to redistribute the filtering error over multiple future time steps.

In exemplary embodiments, a gain is applied to the integrated error signal 112 to produce the feedback signal used in block 104 (block 114). Such a gain can be applied as known to those skilled in the art to control the response of a feedback loop. The feedback gain determines how rapidly the filtering error is redistributed back into the filtered rate output 101. For example, if you want the filtering error for a given time step to feed back quickly (over the course of few future time steps), then the gain can be set high and vice-versa to feed back slowly (over the course of many future time steps). That is, the feedback gain will be set to generate a desired feedback rate in order to limit the size and duration of signal transients in the feedback signal 103, which can cause problems for the system and is one reason why filters are used in MEMS sensors as described above. So, for example, if method 100 is performed by a MEMS every millisecond and if the error output changed by too much during a time step, the gain applied in block 114 could limit the amount of error output fed back into the system during this time step. The remainder would then be added to the system during future time steps at a rate controlled by the feedback gain. The rate at which the gain is set depends on the application of the MEMS.

In any case, the feedback signal 103 generated by the feedback loop in a given time step is applied to the MEMS sensor signal 102 (block 104) for the next time step. The feedback signal 103 is applied to the MEMS sensor signal 102 prior to the MEMS sensor signal 102 being filtered in block 106. As a result, the filtering characteristics for the MEMS sensor will remain the same. In an example, the feedback signal 103 is subtracted from the MEMS sensor rate signal 102 to produce a first combined signal. This first combined signal is the signal filtered at block 106.

Figure 2:
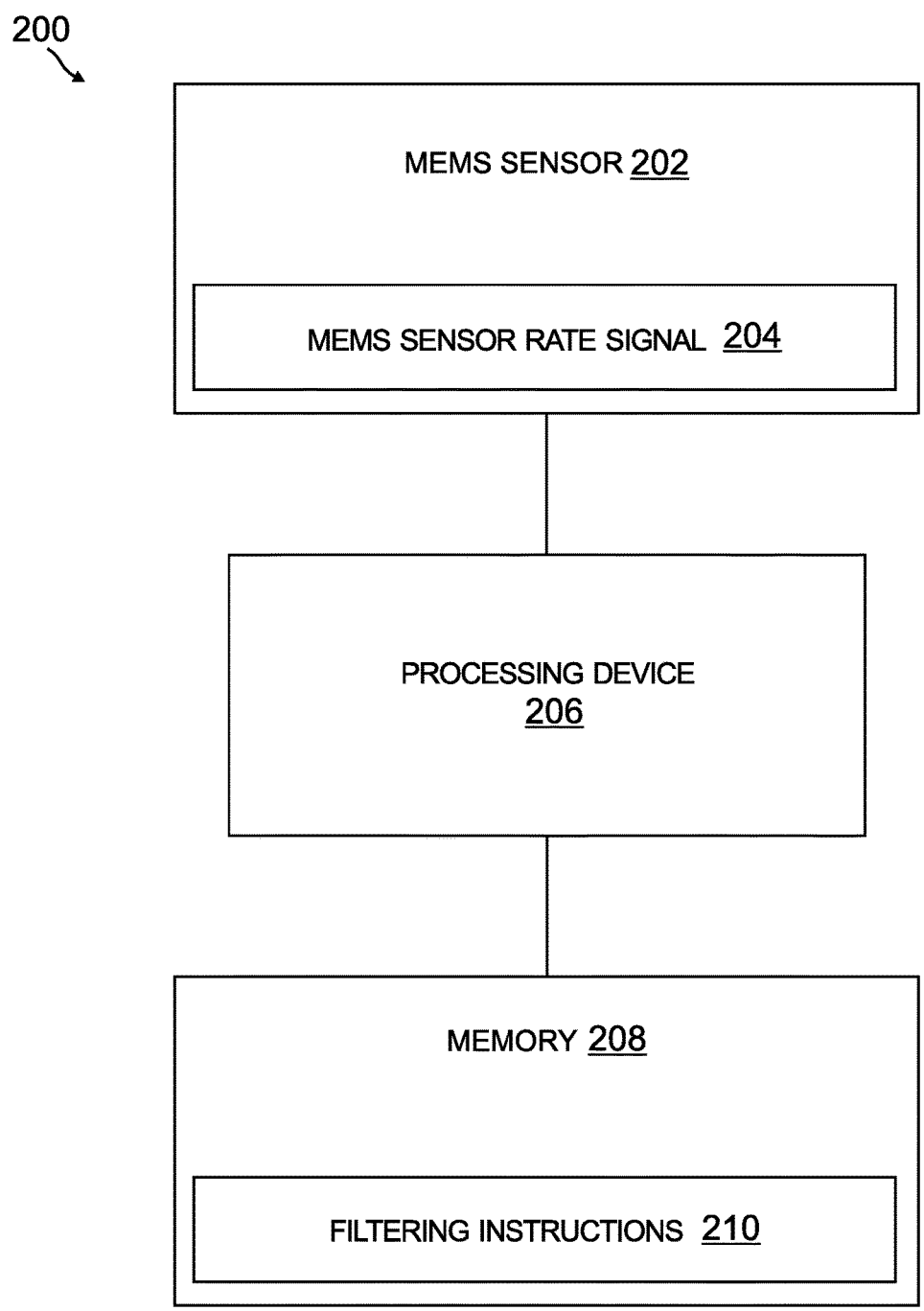
FIG. 2 is a block diagram of an example system for MEMS sensor filtering with error feedback.

FIG. 2 is an example system 200 for micro-electromechanical system (MEMS) sensor filtering with error feedback. The system 200 includes at least MEMS sensor 202 configured to produce at least one MEMS sensor rate signal 204, at least one memory device 208 configured to store filtering instructions 210 and at least one processing device 206 communicatively coupled to the at least one MEMS sensor 202 and the at least one memory device 208. Further, when the at least one processing device 206 executes the filtering instructions 210 stored in memory 208, the processing device 206 subtracts from the at least one microelectromechanical system sensor rate signal 204, a feedback signal from a feedback loop, to produce a first combined signal. Further, the filtering instructions 210, when executed by the processing device 206, cause the at least one processing device 206 to filter the first combined signal to produce a filtered rate output and subtract the at least one MEMS sensor rate signal from the filtered rate output to produce the error signal, wherein the error signal is used in the feedback loop to generate a feedback signal for a future time step. The error signal, the MEMS sensor 202, the MEMS sensor rate signal 204 produced by the MEMS sensor 202 and the filters can have some or all of the same characteristics as the error signal, the MEMS, the MEMS sensor rate signal produced by the MEMS and the filters discussed above in FIG. 1, respectively.

Moreover, the filtering instructions 210, when executed by the at least one processing device 206, cause the at least one processing device 206 to integrate the error signal in the feedback loop to generate an integrated error signal which is used to generate the feedback signal for a future time step. In addition, the filtering instructions can cause the at least one processing device 206 to apply a gain to the error signal to generate the feedback signal for a future time step, which is subtracted from the MEMS sensor rate signal of the future time step to produce the first combined signal of the future time step. Similarly, the delays and the gains discussed here can have some or all of the same characteristics as the delays and gains discussed above in relation to FIG. 1.

In certain embodiments, the one or more processing devices 206 can include a central processing unit (CPU), microcontroller, microprocessor (e.g., a digital signal processor (DSP)), field programmable gate array (FPGA), application specific integrated circuit (ASIC), or other processing device. In certain embodiments, the memory 208 is an electronic hardware device for storing machine readable data and instructions. In one embodiment, the memory 208 stores information on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

Example Embodiments

Example 1 includes a filtering method for a micro-electromechanical system sensor rate signal comprising: providing a micro-electromechanical system sensor rate signal; subtracting from the micro-electromechanical system sensor rate signal, a feedback signal from a feedback loop, to produce a first combined signal; filtering the first combined signal to produce a filtered rate output; and subtracting the micro-electromechanical system sensor rate signal from the filtered rate output to produce an error signal, wherein the error signal is used in the feedback loop to generate a feedback signal for a future time step.

Example 2 includes the filtering method for a micro-electromechanical system sensor rate signal of Example 1, wherein the feedback loop integrates the error signal to generate an integrated error signal which is used to generate the feedback signal for a future time step.

Example 3 includes the filtering method for a micro-electromechanical system sensor rate signal of any of Examples 1-2, wherein a gain is applied to the error signal to generate the feedback signal for a future time step, which is subtracted from the micro-electromechanical system sensor rate signal of the future time step to produce the first combined signal of the future time step.

Example 4 includes the filtering method for a micro-electromechanical system sensor rate signal of any of Examples 1-3, comprising delaying the micro-electromechanical system sensor rate signal before subtracting the micro-electromechanical system rate signal from the filtered rate output to compensate for delay caused by the filter in the filtered rate output.

Example 5 includes the filtering method for a micro-electromechanical system sensor rate signal of any of Examples 1-4, wherein the filter comprises at least one of the following filters: a finite impulse response filter, an infinite impulse response filter, a rate limiting filter, a clipping filter, and a smoothing filter.

Example 6 includes the filtering method for a micro-electromechanical system sensor rate signal of any of Examples 1-5, wherein filtering the first combined signal comprises using more than one filter on the first combined signal to produce the filtered rate output.

Example 7 includes a micro-electromechanical sensor system comprising: at least one micro-electromechanical sensor configured to produce at least one micro-electromechanical system sensor rate signal; at least one memory device configured to store filtering instructions; and at least one processing device communicatively coupled to the at least one micro-electromechanical sensor and the at least one memory device, wherein the filtering instructions, when executed by the at least one processing device, cause the at least one processing device to: subtract from the at least one micro-electromechanical system sensor rate signal, a feedback signal from a feedback loop, to produce a first combined signal; filter the first combined signal to produce a filtered rate output; and subtract the at least one micro-electromechanical system sensor rate signal from the filtered rate output to produce an error signal, wherein the error signal is used in the feedback loop to generate a feedback signal for a future time step.

Example 8 includes the micro-electromechanical sensor system of Example 7, wherein the filtering instructions, when executed by the at least one processing device, cause the at least one processing device to integrate the error signal in the feedback loop to generate an integrated error signal which is used to generate the feedback signal for a future time step.

Example 9 includes the micro-electromechanical sensor system of any of Examples 7-8, wherein the filtering instructions, when executed by the at least one processing device, cause the at least one processing device to apply a gain to the error signal to generate the feedback signal for a future time step, which is subtracted from the micro-electromechanical system sensor rate signal of the future time step to produce the first combined signal of the future time step.

Example 10 includes the micro-electromechanical sensor system of any of Examples 7-9, wherein the filtering instructions, when executed by the at least one processing device, cause the at least one processing device to apply a delay to the micro-electromechanical system sensor rate signal before subtracting the micro-electromechanical system rate signal from the filtered rate output to compensate for delay caused by the filter in the filtered rate output.

Example 11 includes the micro-electromechanical sensor system of any of Examples 7-10, wherein the filter comprises at least one of the following filters: a finite impulse response filter, an infinite impulse response filter, a rate limiting filter, a clipping filter, and a smoothing filter.

Example 12 includes the micro-electromechanical sensor system of any of Examples 7-11, wherein the filter comprises using more than one filter on the first combined signal to produce the filtered rate output.

Example 13 includes the micro-electromechanical sensor system of any of Examples 7-12, wherein the at least one micro-electromechanical sensor is at least one of the following types of sensors: a gyroscope, an accelerometer or a magnetometer.

Example 14 includes a micro-electromechanical sensor apparatus comprising: at least one micro-electromechanical sensor configured to: produce at least one micro-electromechanical system sensor rate signal; subtract from the micro-electromechanical system sensor rate signal, a feedback signal from a feedback loop, to produce a first combined output; filter the first combined output to produce a filtered signal output; and subtract the at least one micro-electromechanical system sensor signal from the filtered rate output to produce the error output, wherein the error signal is used in the feedback loop to generate a feedback signal for a future time step.

Example 15 includes the micro-electromechanical sensor apparatus of Example 14, wherein the at least one micro-electromechanical sensor is further configured to integrate the error signal in the feedback loop to generate an integrated error signal which is used to generate the feedback signal for a future time step.

Example 16 includes the micro-electromechanical sensor apparatus of any of Examples 14-15, wherein the at least one micro-electromechanical sensor is further configured to apply a gain to the error signal to generate the feedback signal for a future time step, which is subtracted from the micro-electromechanical system sensor rate signal of the future time step to produce the first combined signal of the future time step.

Example 17 includes the micro-electromechanical sensor apparatus of any of Examples 14-16, wherein the at least one micro-electromechanical sensor is further configured to apply a delay to the micro-electromechanical system sensor rate signal before subtracting the micro-electromechanical system rate signal from the filtered rate output to compensate for delay caused by the filter in the filtered rate output.

Example 18 includes the micro-electromechanical sensor apparatus of any of Examples 14-17, wherein the filter comprises at least one of the following filters: a finite impulse response filter, an infinite impulse response filter, a rate limiting filter, a clipping filter, and a smoothing filter.

Example 19 includes the micro-electromechanical sensor apparatus of any of Examples 14-18, wherein the filter comprises using more than one filter on the first combined signal to produce the filtered rate output.

Example 20 includes the micro-electromechanical sensor apparatus of any of Examples 14-19, wherein the at least one micro-electromechanical sensor is at least one of the following types of sensors: a gyroscope, an accelerometer or a magnetometer.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A filtering method for a micro-electromechanical system (MEMS) sensor rate signal, the filtering method comprising:
   providing a micro-electromechanical system sensor rate signal from a MEMS sensor in a system including inertial navigation applications;
   with a first signal-combining circuit, subtracting, from the micro-electromechanical system sensor rate signal, a feedback signal from a feedback loop, to produce a first combined signal;
   with a filter circuit, filtering the first combined signal to produce a filtered rate output;
   with a second signal-combining circuit, subtracting the micro-electromechanical system sensor rate signal from the filtered rate output to produce an error signal;
   with the feedback loop, integrating the error signal to produce an integrated error signal;
   wherein the integrated error signal is used in the feedback loop to generate a feedback signal for a future time step; and
   wherein an accumulation of error in the filtered rate output is reduced and a navigation performance of the system is improved.

2. The filtering method for a micro-electromechanical system sensor rate signal of claim 1, wherein a gain is applied to the integrated error signal to generate the feedback signal for the future time step, and wherein the feedback signal for the future time step is subtracted from the micro-electromechanical system sensor rate signal of the future time step to produce the first combined signal of the future time step.

3. The filtering method for a micro-electromechanical system sensor rate signal of claim 1, comprising delaying the micro-electromechanical system sensor rate signal before subtracting the micro-electromechanical system rate signal from the filtered rate output to compensate for delay caused by the filter in the filtered rate output.

4. The filtering method for a micro-electromechanical system sensor rate signal of claim 1, wherein the filter circuit comprises at least one of the following filter circuits: a finite impulse response filter, an infinite impulse response filter, a rate limiting filter, a clipping filter, and a smoothing filter, wherein, when the at least one filter circuit does not introduce a delay in the filtered rate output relative to the micro-electromechanical system sensor rate signal, the micro-electromechanical system sensor rate signal that corresponds to the filtered rate output for a given time step is the micro-electromechanical system sensor rate signal for that same time step.

5. The filtering method for a micro-electromechanical system sensor rate signal of claim 1, wherein filtering the first combined signal comprises using more than one filter circuit on the first combined signal to produce the filtered rate output.

6. A micro-electromechanical sensor system comprising:
   at least one micro-electromechanical sensor in a system including inertial navigation applications, the at least one micro-electromechanical sensor configured to produce at least one micro-electromechanical system sensor rate signal;
   at least one memory device configured to store filtering instructions; and
   at least one processing circuit communicatively coupled to the at least one micro-electromechanical sensor and the at least one memory device, wherein the filtering instructions, when executed by the at least one processing circuit, cause the at least one processing circuit to:
      subtract from the at least one micro-electromechanical system sensor rate signal, a feedback signal from a feedback loop, to produce a first combined signal;
      filter the first combined signal to produce a filtered rate output; and
      subtract the at least one micro-electromechanical system sensor rate signal from the filtered rate output to produce an error signal;
      integrate the error signal to produce an integrated error signal;

wherein the integrated error signal is used in the feedback loop to generate a feedback signal for a future time step; and wherein an accumulation of error in the filtered rate output is reduced and a navigation performance of the system is improved.

7. The micro-electromechanical sensor system of claim 6, wherein the filtering instructions, when executed by the at least one processing circuit, cause the at least one processing circuit to apply a gain to the integrated error signal to generate the feedback signal for the future time step, and to subtract the feedback signal for the future time step from the micro-electromechanical system sensor rate signal of the future time step to produce the first combined signal of the future time step.

8. The micro-electromechanical sensor system of claim 6, wherein the filtering instructions, when executed by the at least one processing circuit, cause the at least one processing circuit to apply a delay to the micro-electromechanical system sensor rate signal before subtracting the micro-electromechanical system rate signal from the filtered rate output to compensate for delay caused by the filter in the filtered rate output.

9. The micro-electromechanical sensor system of claim 6, wherein the filtering instructions, when executed by the at least one processing circuit, cause the at least one processing circuit to operate as at least one of the following filters: a finite impulse response filter, an infinite impulse response filter, a rate limiting filter, a clipping filter, and a smoothing filter, wherein, when the processing circuit does not introduce a delay in the filtered rate output relative to the micro-electromechanical system sensor rate signal, the micro-electromechanical system sensor rate signal that corresponds to the filtered rate output for a given time step is the micro-electromechanical system sensor rate signal for that same time step.

10. The micro-electromechanical sensor system of claim 6, wherein the filtering instructions, when executed by the at least one processing circuit, cause the at least one processing circuit to operate as more than one filter on the first combined signal to produce the filtered rate output.

11. The micro-electromechanical sensor system of claim 6, wherein the at least one micro-electromechanical sensor is at least one of the following types of sensors: a gyroscope, an accelerometer or a magnetometer.

12. A system for inertial navigation applications, the system comprising:
at least one micro-electromechanical sensor; and
electronic circuitry coupled to the at least one micro-mechanical sensor and configured to:
produce at least one micro-electromechanical system sensor rate signal;
subtract from the micro-electromechanical system sensor rate signal, a feedback signal from a feedback loop, to produce a first combined output;
filter the first combined output to produce a filtered rate output;
subtract the at least one micro-electromechanical system sensor signal from the filtered rate output to produce an error signal;
integrate the error signal to produce an integrated error signal;
wherein the integrated error signal is used in the feedback loop to generate a feedback signal for a future time step; and
wherein an accumulation of error in the filtered rate output is reduced and a navigation performance of the system is improved.

13. The system of claim 12, wherein the electronic circuitry of the at least one micro-electromechanical sensor is further configured to apply a gain to the integrated error signal to generate the feedback signal for the future time step, and to subtract the feedback signal for the future time step from the micro-electromechanical system sensor rate signal of the future time step to produce the first combined signal of the future time step.

14. The system of claim 12, wherein the electronic circuitry of the at least one micro-electromechanical sensor is further configured to apply a delay to the micro-electromechanical system sensor rate signal before subtracting the micro-electromechanical system sensor rate signal from the filtered rate output to compensate for delay caused by the electronic circuitry in the filtered rate output.

15. The system of claim 12, wherein the electronic circuitry comprises at least one of the following filters configured to filter the first combined output: a finite impulse response filter, an infinite impulse response filter, a rate limiting filter, a clipping filter, and a smoothing filter, wherein, when the at least one filter does not introduce a delay in the filtered rate output relative to the micro-electromechanical system sensor rate signal, the micro-electromechanical system sensor rate signal that corresponds to the filtered rate output for a given time step is the micro-electromechanical system sensor rate signal for that same time step.

16. The system of claim 12, wherein the electronic circuitry includes more than one filter and is configured to use the more than one filter on the first combined signal to produce the filtered rate output.

17. The system of claim 12, wherein the at least one micro-electromechanical sensor is at least one of the following types of sensors: a gyroscope, an accelerometer or a magnetometer.

* * * * *